(12) United States Patent
Simin et al.

(10) Patent No.: US 9,887,267 B2
(45) Date of Patent: Feb. 6, 2018

(54) NORMALLY-OFF FIELD EFFECT TRANSISTOR

(71) Applicant: Sensor Electronic Technology, Inc., Columbia, SC (US)

(72) Inventors: Grigory Simin, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/234,350

(22) Filed: Aug. 11, 2016

(65) Prior Publication Data

US 2017/0047438 A1 Feb. 16, 2017

Related U.S. Application Data

(60) Provisional application No. 62/203,518, filed on Aug. 11, 2015.

(51) Int. Cl.
*H01L 29/00* (2006.01)
*H01L 29/40* (2006.01)
(Continued)

(52) U.S. Cl.
CPC .......... *H01L 29/402* (2013.01); *H01L 29/423* (2013.01); *H01L 29/42316* (2013.01); *H01L 29/7783* (2013.01); *H01L 29/7832* (2013.01); *H01L 29/15* (2013.01); *H01L 29/2003* (2013.01); *H01L 29/41758* (2013.01)

(58) Field of Classification Search
CPC .......... H01L 29/7787; H01L 29/66462; H01L 29/201; H01L 29/15; H01L 29/402; H01L 29/423; H01L 29/42316; H01L 29/7783; H01L 29/7832; H01L 29/41758; H01L 29/2003
See application file for complete search history.

(56) References Cited

U.S. PATENT DOCUMENTS 5,049,951 A * 9/1991 Goronkin ............... B82Y 10/00
257/192
5,142,349 A * 8/1992 Zhu ..................... H01L 27/0605
257/192

(Continued)

OTHER PUBLICATIONS

Nepal et al., "Temperature and compositional dependence of the energy band gap of AlGaN alloys", 2005, Appl. Phys. Lett. 87, pp. 242104-1-242104-4; Dec. 7, 2005.*

(Continued)

*Primary Examiner* — Nikolay Yushin
(74) *Attorney, Agent, or Firm* — LaBatt, LLC

(57) ABSTRACT

A normally-off transistor with a high operating voltage is provided. The transistor can include a barrier above the channel and an additional barrier layer located below the channel. A source electrode and a drain electrode are connected to the channel and a gate electrode is connected to the additional barrier layer located below the channel. The bandgap for each of the barrier layers can be larger than the bandgap for the channel. A polarization charge induced at the interface between the additional barrier layer below the channel and the channel depletes the channel. A voltage can be applied to the bottom barrier to induce free carriers into the channel and turn the channel on.

20 Claims, 14 Drawing Sheets

(51) Int. Cl.
*H01L 29/423* (2006.01)
*H01L 29/778* (2006.01)
*H01L 29/78* (2006.01)
H01L 29/15 (2006.01)
H01L 29/417 (2006.01)
H01L 29/20 (2006.01)

(56) References Cited

U.S. PATENT DOCUMENTS

| | | | | |
|---|---|---|---|---|
| 7,126,426 | B2* | 10/2006 | Mishra | H01L 27/0605 257/E27.012 |
| 7,935,983 | B2* | 5/2011 | Saito | H01L 29/7787 257/183 |
| 2005/0051800 | A1* | 3/2005 | Mishra | H01L 27/0605 257/202 |
| 2008/0023706 | A1* | 1/2008 | Saito | H01L 29/7787 257/76 |

OTHER PUBLICATIONS

Vurgaftman et al., "Band parameters for III-V compound semiconductors and their alloys", 2001, Journal of Applied Physics, vol. 89, No. 11, pp. 58-15-58-5875; Feb. 14, 2001.*

Adivarahan, et al., "Double-Recessed High-Frequency AlInGaN/InGaN/GaN Metal—Oxide Double Heterostructure Field-Effect Transistors," IEEE Transaction on Electron Devices, Feb. 2008, 5 pages, vol. 55, No. 2.

Iwakami, et al., "Evaluation of AlGaN/GaN Heterostructure Field-Effect Transistors on Si Substrate in Power Factor Correction Circuit," Japanese Journal of Applied Physics, 2007, 3 pages, vol. 46, No. 29.

Karmalkar, et al., "RESURF AlGaN/GaN HEMT for High Voltage Power Switching," IEEE Electron Device Letters, Aug. 2001, vol. 22, No. 8.

Mishra, et al., "AlGaN/GaN HEMTs-An Overview of Device Operation and Applications," Proceedings of the IEEE, Jun. 2002, 10 pages, vol. 90, No. 6.

* cited by examiner

NORMALLY-OFF FIELD EFFECT TRANSISTOR

REFERENCE TO RELATED APPLICATIONS

The current application claims the benefit of U.S. Provisional Application No. 62/203,518, which was filed on 11 Aug. 2015, and which is hereby incorporated by reference.

TECHNICAL FIELD

The disclosure relates generally to semiconductor devices, and more particularly, to a solution for achieving a high operating voltage in a normally-off field-effect transistor (FET).

BACKGROUND ART

State of the art high-power field-effect transistors such as gallium nitride (GaN) heterostructure field-effect transistors (HFETs) feature record high powers and breakdown voltages. Although these features make them extremely promising for various applications in power electronics, certain material and device specifics significantly limit their performance characteristics.

For example, FIG. 1 shows an illustrative schematic structure of a GaN-based HFET according to the prior art. The GaN-based HFET is essentially a normally-on device. That is, the device channel is conducting in the absence of the applied gate voltage. For most power electronics applications, normally-on devices are not acceptable since a gate voltage source failure can result in extremely high currents flowing through the power transistors and other connected circuit elements and result in partial or total damage of the blocks and systems.

One approach to achieve a normally-off condition in a GaN-based HFET includes removing a portion of the area under the gate, e.g., via etching and/or the like. For example, FIG. 2 shows an illustrative schematic structure of a recessed gate GaN-based HFET according to the prior art. A circuit-based approach uses a combination of GaN-based HFETs with normally-off silicon (Si)-based devices forming cascade connections, or Baliga pairs. For example, FIG. 3 shows an illustrative comparison of an AlGaN/GaN-based HFET with a cascade circuit according to the prior art. Both types of the above approaches lead to significant performance degradation such as excessive leakage currents, lower breakdown voltage and poor reliability in normally-off HFETs of the type shown in FIG. 2, or due to significant parasitic parameters and additional series resistance of Si devices in cascade type circuits shown in FIG. 3.

One approach to improve electric field uniformity and increase the breakdown voltage is a device with underlying p-layers (e.g., reduced surface field (RESURF) devices), which is illustrated in FIG. 4. However, the RESURF design does not achieve normally-off operation nor does it allow for the bottom gate control of the device state.

SUMMARY OF THE INVENTION

Aspects of the invention provide a solution for achieving a high operating voltage in a normally-off field-effect transistor (FET). The FET can include a barrier above the channel and an additional barrier layer located below the channel. A source and drain electrode is connected to the channel and a gate electrode is connected to the additional barrier layer located below the channel. The bandgap for each of the barrier layers is larger than the bandgap for the channel. A polarization charge induced at the interface between the additional barrier layer below the channel and the channel depletes the channel. A voltage can be applied to the bottom barrier to induce free carriers into the channel, thus turning the channel on. In this manner, the bottom barrier layer can act as a gate.

A first aspect of the invention provides a field effect transistor comprising: a first barrier and a second barrier; a channel located between the first barrier and the second barrier, wherein a bandgap for each of the first barrier and the second barrier is larger than a bandgap for the channel; a source electrode and a drain electrode connected to the channel; and a gate electrode connected to the first barrier.

A second aspect of the invention provides a field effect transistor comprising: a first barrier and a second barrier; a channel located between the first barrier and the second barrier, wherein the first barrier comprises a thickness and a dopant concentration that induces free carriers into the channel in response to a polarization charge induced at an interface between the first barrier and the channel; a source electrode and a drain electrode connected to the channel; and a gate electrode connected to the first barrier.

A third aspect of the invention provides a method of fabricating a device comprising: forming a first barrier and a second barrier; forming a channel located between the first barrier and the second barrier, wherein a bandgap for each of the first barrier and the second barrier is larger than a bandgap for the channel; forming a source electrode and a drain electrode connected to the channel; and forming a gate electrode connected to the first barrier.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solution for achieving a high operating voltage in a normally-off field-effect transistor (FET).

As used herein, it is understood that the phrase "normally-on channel" means a channel that is in a conducting state when no external voltage or electric field is applied to the channel. Similarly, it is understood that the phrase "normally-off channel" means a channel that is in the non-conducting state when no external voltage or electric field is applied to the channel. Unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

Figure 1:
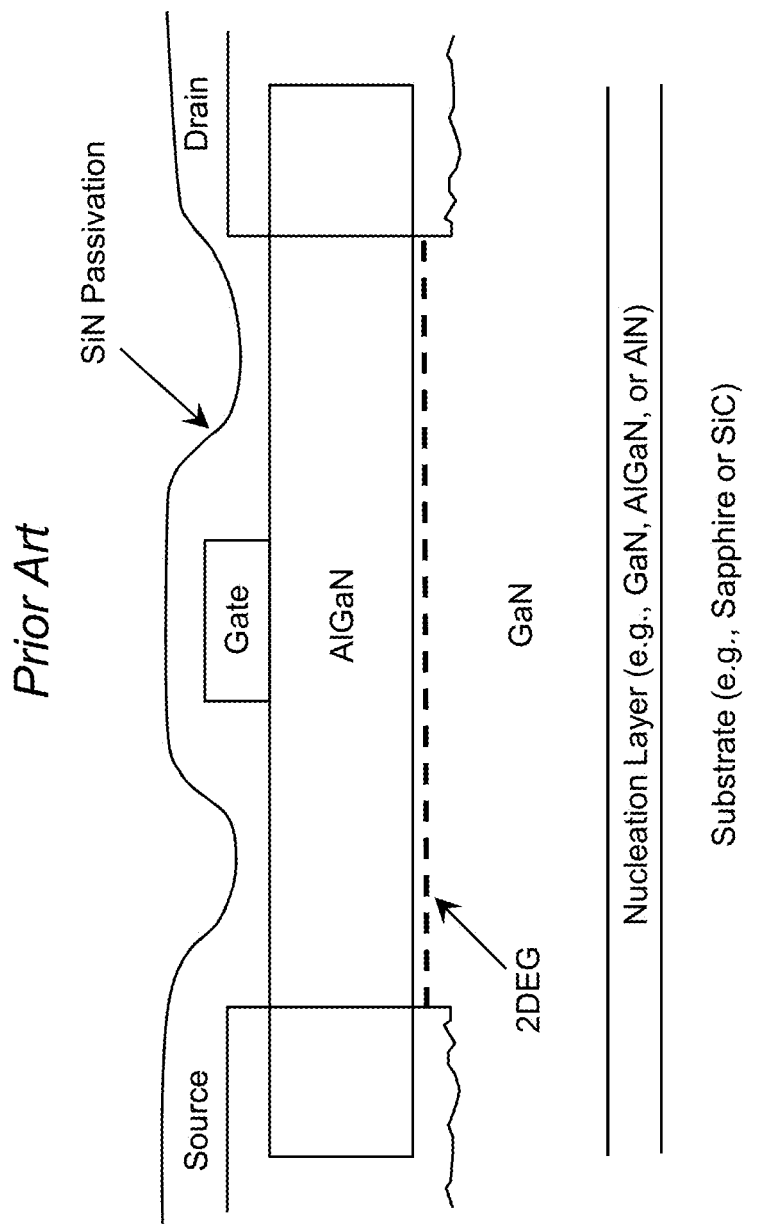
FIG. 1 shows an illustrative schematic structure of a gallium nitride-based heterostructure field effect transistor according to the prior art.
Figure 2:
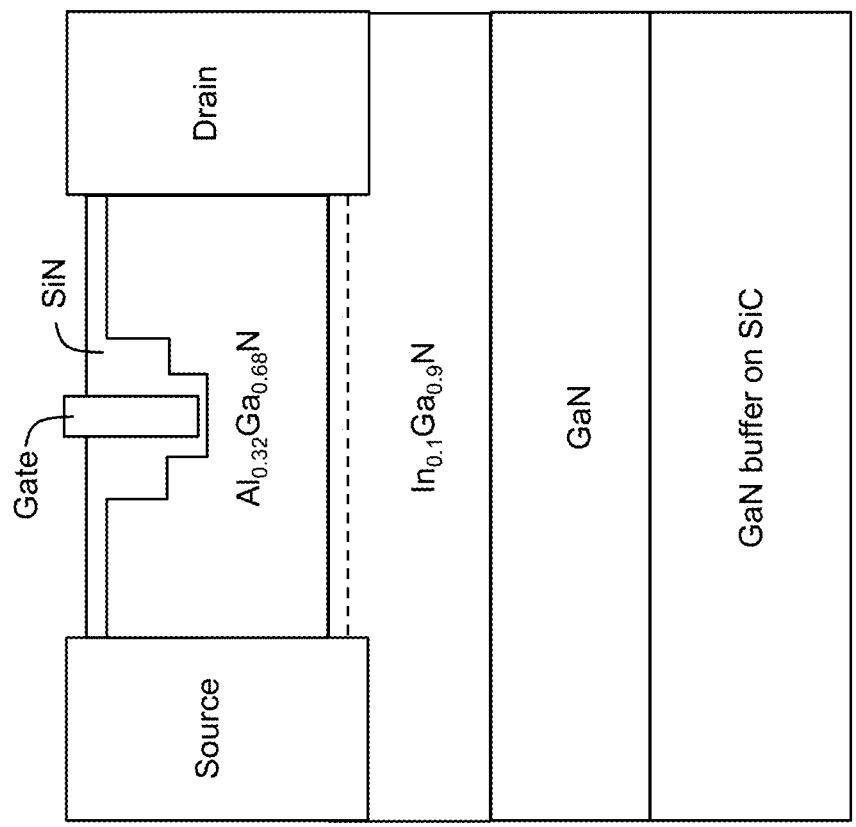
FIG. 2 shows an illustrative schematic structure of a recessed gate gallium nitride-based heterostructure field effect transistor according to the prior art.
Figure 3:
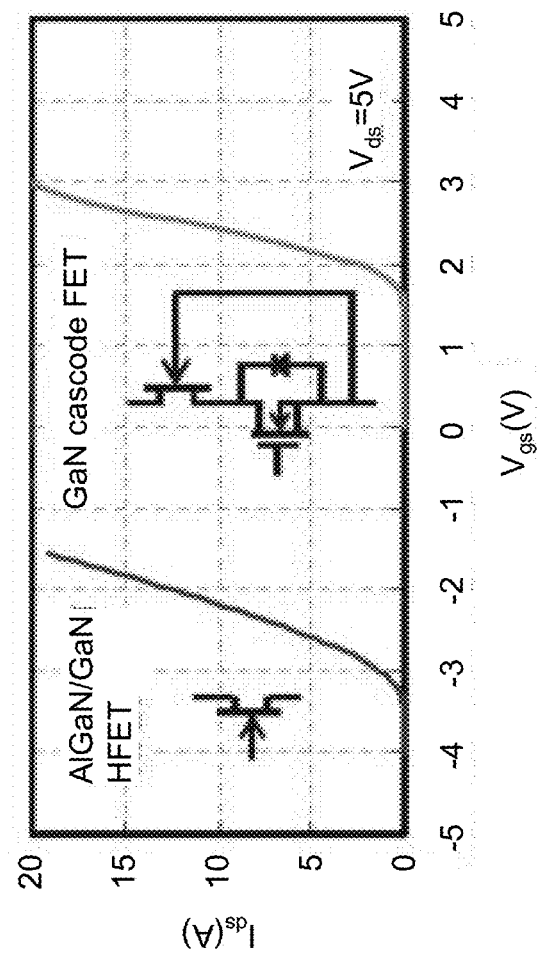
FIG. 3 shows an illustrative comparison of an AlGaN/GaN-based HFET with a cascade circuit according to the prior art.
Figure 4:
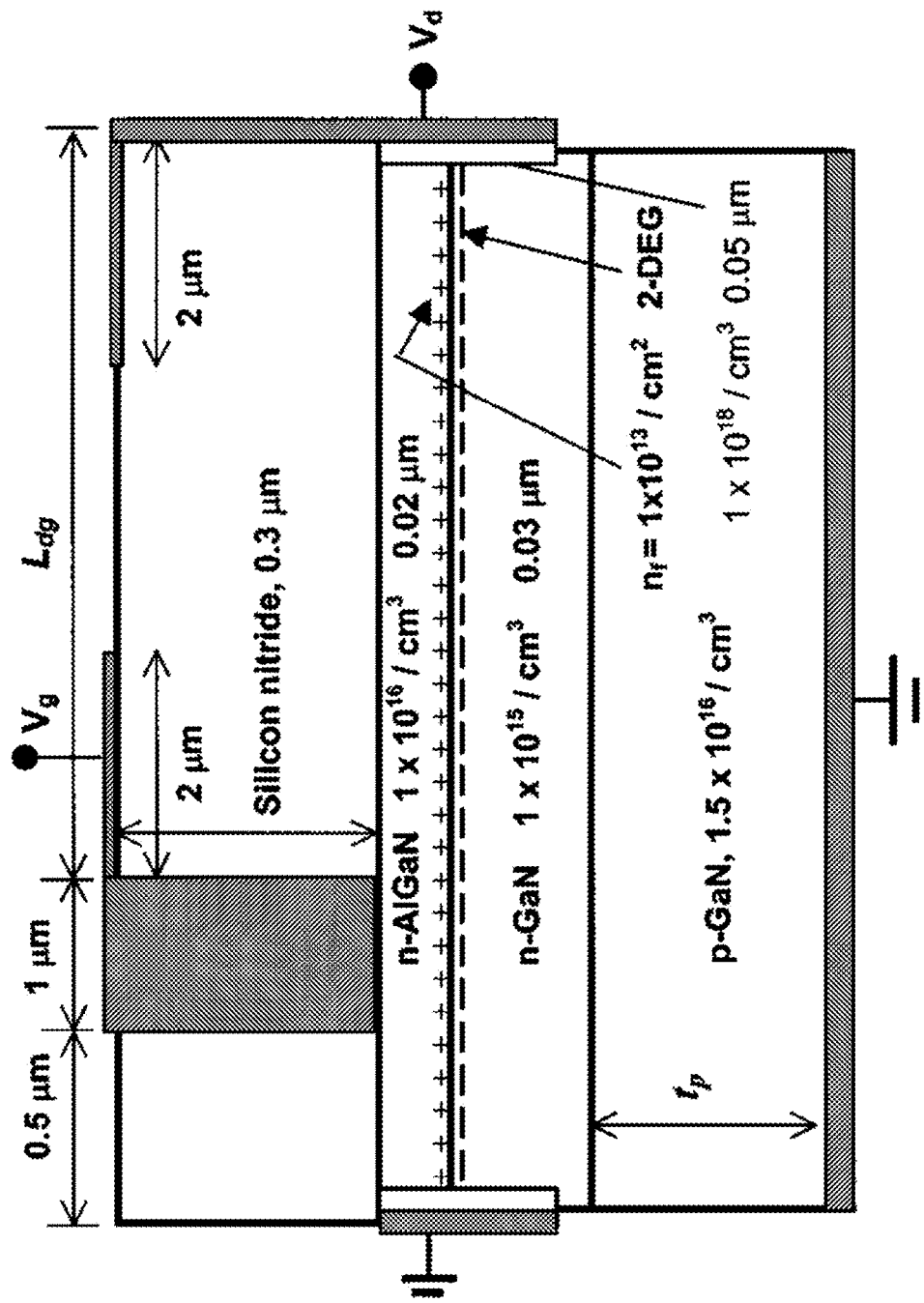
FIG. 4 shows an illustrative schematic structure of a RESURF device according to the prior art.
Figure 5:
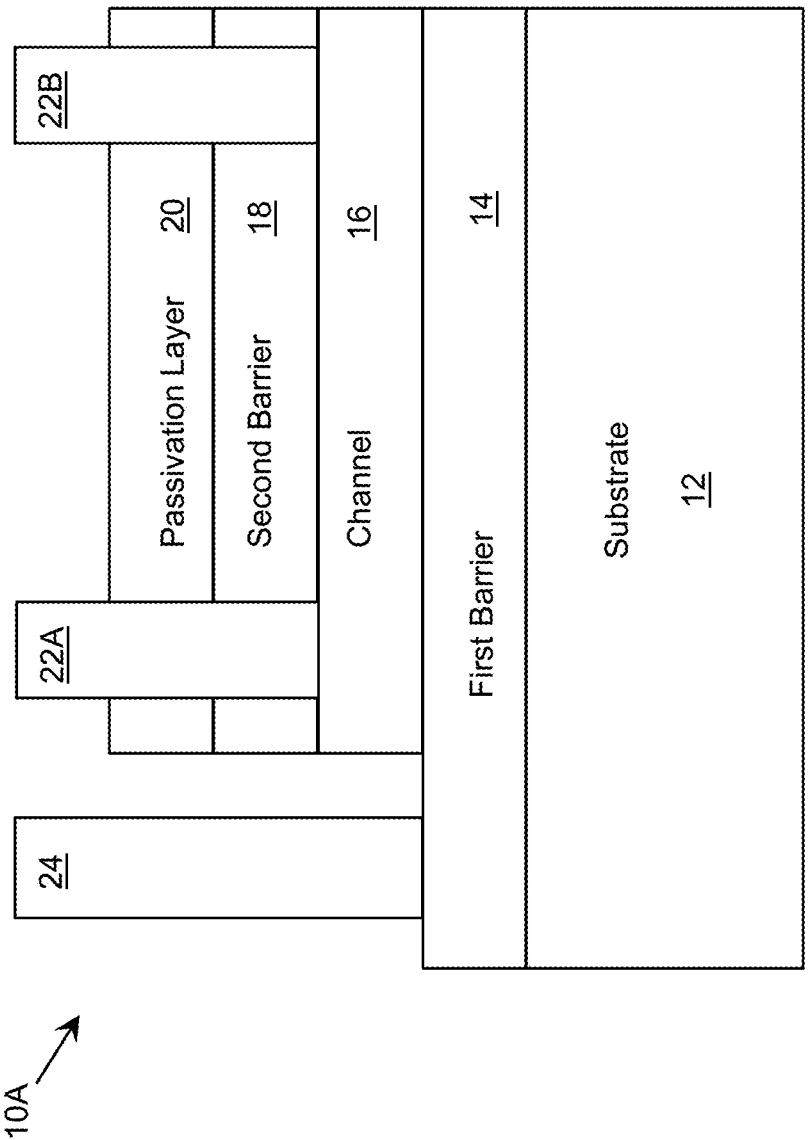
FIG. 5 shows a cross-section view of an illustrative semiconductor device according to an embodiment.

Turning to the drawings, FIG. 5 shows a cross-section view of an illustrative semiconductor device 10A according to a first embodiment. The device 10A is shown including a substrate 12, a first barrier 14, a channel 16, a second barrier 18, a passivation layer 20, a source electrode 22A, a drain electrode 22B, and a gate 24, each of which can be manufactured and fabricated using any solution. For example, the channel 16 can be formed by an active layer and/or the device 10A can include multiple channels 16, each of which is formed by a distinct layer. The channel 16 can be formed by a quantum well in the layer between the first barrier 14 and the second barrier 18. The channel 16 can be immediately adjacent to each of the barriers 14, 18. The first and second barriers 14, 18 also can comprise a single layer or a multi-layer structure.

However, it is understood that the heterostructure shown for device 10A is only illustrative of various possible configurations for the device. For example, the embodiment of the device 10A can be formed without the passivation layer 20. Regardless, the heterostructure of the device 10A can include various layers made from any of a plurality of materials systems. Furthermore, one or more of the layers in a heterostructure described herein can include one or more attributes to alleviate strain. For example, a layer can be formed of a superlattice structure. In an embodiment, any of the layers 14, 16, 18, 20 can be formed of a superlattice structure. The source electrode 22A and the drain electrode 22B can be connected to the channel layer 16, while the gate electrode 24 is connected to the first barrier 14. In an embodiment, the gate electrode 24 can be surrounded by a dielectric material in order to provide surface passivation for the adjacent layers 14, 16, 18.

In an embodiment, the substrate 12 is formed of SiC, the channel 16 is formed of a gallium nitride (GaN) layer, the first and second barriers 14, 18 are formed of an aluminum gallium nitride (AlGaN) layer, and the passivation layer 20 is formed of a silicon nitride layer ($Si_3N_4$). However, it is understood that this is only illustrative of various possible group III nitride based devices. To this extent, one or more layers forming the first barrier 14, channel 16, and/or second barrier 18 can be formed of any combination of various types of group III nitride materials comprising one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, InGaN, GaBN, AlGaInN, AlGaBN, AlInBN, and AlGaInBN with any molar fraction of group III elements. Furthermore, it is understood that the device 10A can be formed from other semiconductor materials, including: other types of group III-V materials, such as GaAs, GaAlAs, InGaAs, indium phosphorus (InP), and/or the like; group II-VI materials, such as zinc oxide (ZnO), and/or the like; silicon (Si); germanium (Ge); silicon carbide (SiC); and/or the like. Similarly, the substrate 12 can be formed of any of various types of compound semiconductor or dielectric materials, including, for example: sapphire; diamond; mica; ceramic; germanium (Ge); various types of group III nitride substrates including GaN, AlN, BN, AlGaN, AlGaInN, GaBN, AlBN, AlInBN, AlGaBN, and/or the like; $LiGaO_2$, $LiNbO_2$, ZnO; Si; SiC; GaAs; and/or the like. Furthermore, the substrate 12 can comprise a conducting and/or semiconducting substrate.

The passivation layer 20 can comprise any type of suitable dielectric material. In an embodiment, each of the gate 24, the source electrode 22A, and the drain electrode 22B is formed of metal. However, it is understood that each of the gate 24, the source electrode 22A, and the drain electrode 22B can be formed of any type of conducting material, including for example, a semiconductor, a crystalline material, a polycrystalline material, and/or the like. Although a buffer layer is not shown, it is understood that the semiconductor device 10A can include a buffer layer located between the substrate 12 and the first barrier 14. The buffer layer can be formed of any combination of various types of group III nitride materials, including AlN, GaN, InN, BN, AlGaN, AlInN, AlBN, InGaN, GaBN, AlGaInN, AlGaBN, AlInBN, and AlGaInBN with any molar fraction of group III elements.

In an embodiment, the channel 16 is formed of a material with a bandgap that is smaller than the material(s) forming the first and second barriers 14, 18. In an embodiment, these layers 14, 16, 18 can be formed of the same material with different compositions. For example, the layers 14, 16, 18 can all be formed of AlGaN, but with different Al compositions to achieve different bandgaps. In another embodiment, the layers 14, 16, 18 can be formed of GaN/AlGaN or AlInGaN with different Al and In compositions. In another embodiment, the layers 14, 16, 18 can be formed of different materials, such as GaN/AlN, Si/GaN, and/or the like. In an embodiment, the first barrier 14 can include a doping type that is the opposite of the doping type for the channel 16. For example, the channel 16 may be doped with n-type dopants, while the first barrier 14 is doped with p-type dopants. Furthermore, the second barrier 18 can be doped with the same doping type as the channel 16 (e.g., Si or $O_2$ n-type dopants).

The semiconductor device 10A can be operated as a field-effect transistor (FET) having with a normally-off channel 16 and a high operating voltage. In particular, when a voltage applied to the gate 24 is zero or below the threshold voltage for the device 10A, the device 10A is in the non-conducting state. Furthermore, when a voltage applied to the gate 24 is above the threshold voltage for the device 10A, the device 10A is in the conducting state. In order to achieve this normally-off state, the additional barrier (e.g., first barrier 14) located below the channel 16 has a polarization charge at the interface with the above lying channel 16, which results in depletion of the channel 16. The voltage applied to the gate 24, and subsequently to the first barrier 14, can induce free carriers into the channel 16 in order to turn the channel 16 into an on-state. Therefore, the bottom barrier (e.g., the first barrier 14) can act as a gate.

Figure 6:
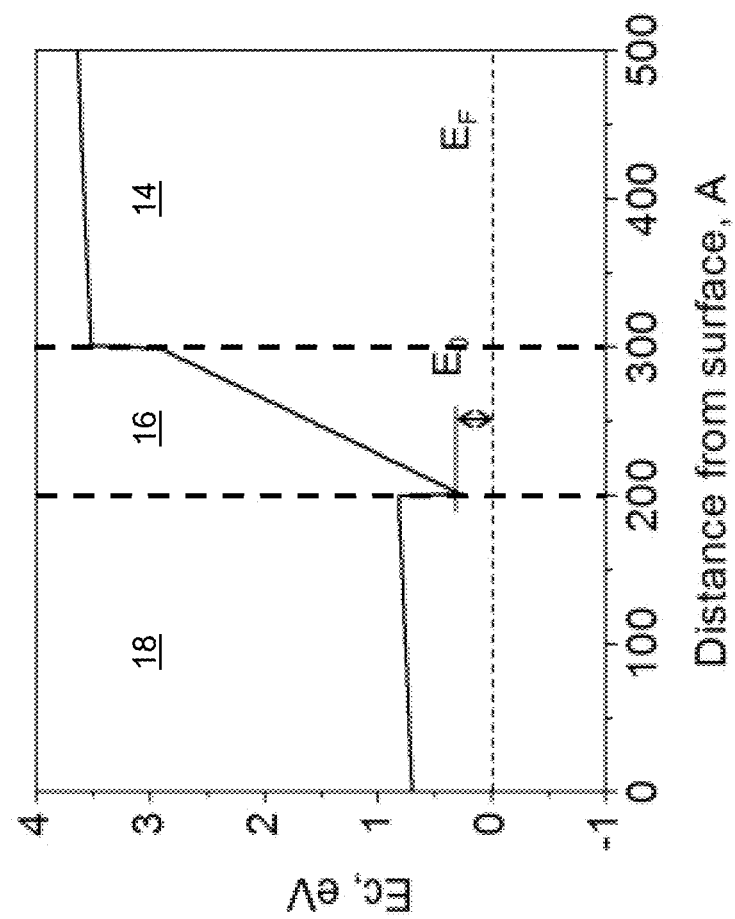
FIG. 6 shows an illustrative band diagram of the AlGaN/GaN/AlGaN structure in equilibrium in a normally-off channel state according to an embodiment.

Turning now to FIG. 6, an illustrative conduction band diagram of an AlGaN/GaN/AlGaN structure shown for the device 10A in FIG. 5 in equilibrium in a normally-off channel state according to an embodiment is shown. This band diagram uses the following layer parameters: for the first barrier 14, a thickness of approximately 3 micrometer (mkm), an aluminum content of approximately 25%, and a dopant concentration of approximately $3 \times 10^{16}$ cm$^{-3}$; for the channel 16, a thickness of approximately 100 Angstroms (Å) and a dopant concentration of approximately $3 \times 10^{15}$ cm$^{-3}$; and for the second barrier 18, a thickness of approximately 200 Å, an aluminum content of approximately 25%, and a dopant concentration of approximately $3 \times 10^{16}$ cm$^{-3}$. As seen in FIG. 6, the conduction band energies are different in the first barrier 14 and the second barrier 18 due to the polarization charges, which pushiness the energies of the channel 16 and the second barrier 18 down.

The band diagram in FIG. 6 shows that the bottom edge of the conduction band in the channel 16 (FIG. 5), $E_0$, is approximately 0.3 eV. This ensures full channel depletion and thus, a normally-off state for the device. A voltage applied to the first barrier 14 (via the gate 24) induces free carriers into the channel 16 to turn the channel into the on-state.

The threshold voltage, $V_{TH}$, for a semiconductor device according to embodiments of the invention can be calculated by adding the voltage needed to lower the bottom edge of the conduction band in the channel to the Fermi level and the corresponding voltage drop across the barrier layer below the channel (e.g., the first barrier 14 in FIG. 5). Therefore, $$V_{TH} \approx V_0 + \frac{\sqrt{2\varepsilon_0 \varepsilon_r q N_a V_0}}{C_p},$$

where $V_0 = E_0/q$, and $E_0$ is the distance between the Fermi level and the bottom of the channel conduction band in equilibrium, $C_p = \varepsilon_0 \varepsilon_r / d_p$, where $d_p$ is the thickness of the barrier below the channel (e.g., the first barrier 14 in FIG. 5).

Figure 7:
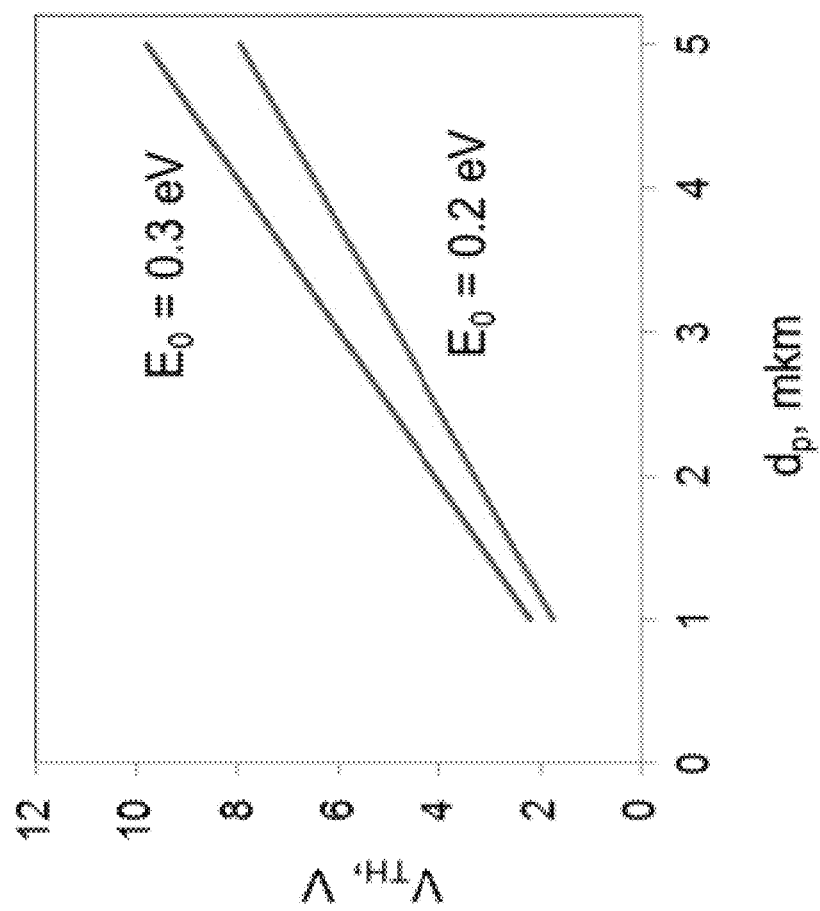
FIG. 7 shows a graph illustrating the dependence of the threshold voltage on the thickness of a barrier layer in an illustrative semiconductor device according to an embodiment.

Turning now to FIG. 7, a graph illustrating the dependence of the threshold voltage, $V_{TH}$, on the thickness of a barrier layer below the channel in an illustrative semiconductor device according to an embodiment is shown. As shown, a threshold voltage above +2 volts (V) can be achieved with a barrier layer thickness of 2-5 mkm for the barrier 14 (FIG. 5) below the channel 16. A high positive threshold voltage can be an important factor for power electronics applications for a transistor. To prevent the gate-drain breakdown, the doping level and thickness of the bottom barrier layer (e.g., barrier 14) also can meet the following requirements for the dopant concentration ($N_A$) and the layer thickness ($d_p$):

$$N_A < \frac{\varepsilon \varepsilon_0 F_{BD}^2}{2qV_{DMAX}} \text{ and} \quad (1)$$

$$d_p > \frac{2V_{DMAX}}{F_{BD}}, \quad (2)$$

where $F_{BD}$ is the breakdown field of the barrier below the channel and $V_{DMAX}$ is the maximum drain voltage for the transistor operation. In an embodiment, the AlGaN material has an exceptionally high breakdown field, in excess of 3-4 MV/cm (depending on the material quality). For example, for a device operating at 600 V maximum drain voltage, the barrier below the channel (assuming $F_{BD}=3$ mV/cm) can meet the following requirements: $N_A < 3.73 \times 10^{16}$ cm$^{-3}$ and $d_p > 4$ mkm.

Figure 8:
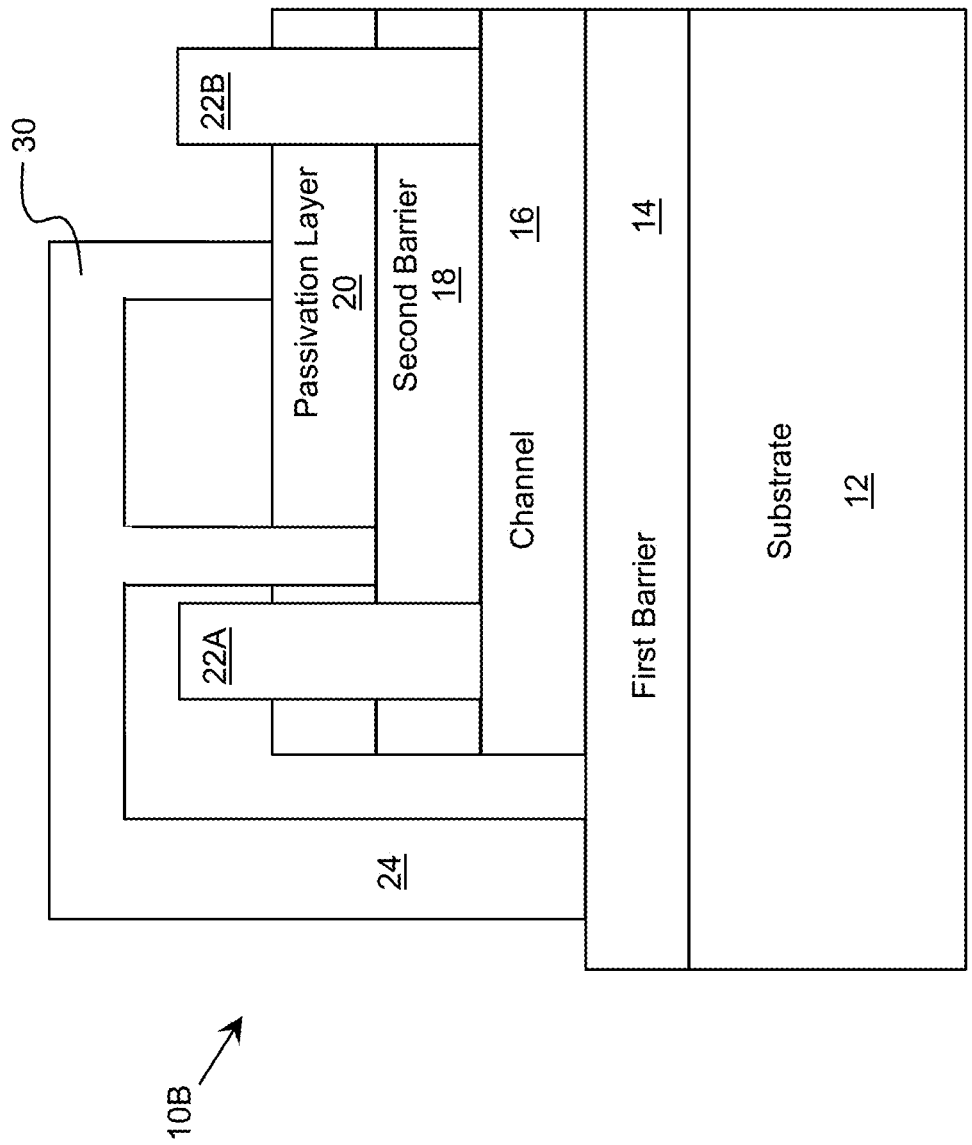
FIG. 8 shows a cross-section view of an illustrative semiconductor device according to an embodiment.

It is understood that various embodiments of a device described herein, such as a field effect transistor, can include one or more additional features. For example, FIG. 8 shows a cross-section view of an illustrative semiconductor device 10B according to an embodiment. The device 10B is similar to the device 10A shown in FIG. 5. However, the device 10B includes a charge control electrode 30 that connects the gate 24 to the passivation layer 20 and/or the second barrier 18 in a location between the source and the drain electrodes 22A, 22B. The charge control electrode 30 can be formed on the surfaces of the passivation layer 20 and/or the second barrier 18 or in trenches formed in one or more of the layers 18, 20. In an embodiment, the charge control electrode 30 is formed of metal. However, it is understood that the charge control electrode 30 can be formed of any type of conducting material, including for example, a semiconductor, a crystalline material, a polycrystalline material, and/or the like.

It is understood that the charge control electrode 30 can be directly connected or capacitively coupled to the passivation layer 20, the second barrier 18, and/or the first barrier 14 (via the gate 24). In another embodiment, as shown in FIG. 9, the device 10C can include a charge control electrode 30 that is connected (directly or capacitively coupled) between the passivation layer 20, the second barrier 18, and the channel 16).

Figure 10:
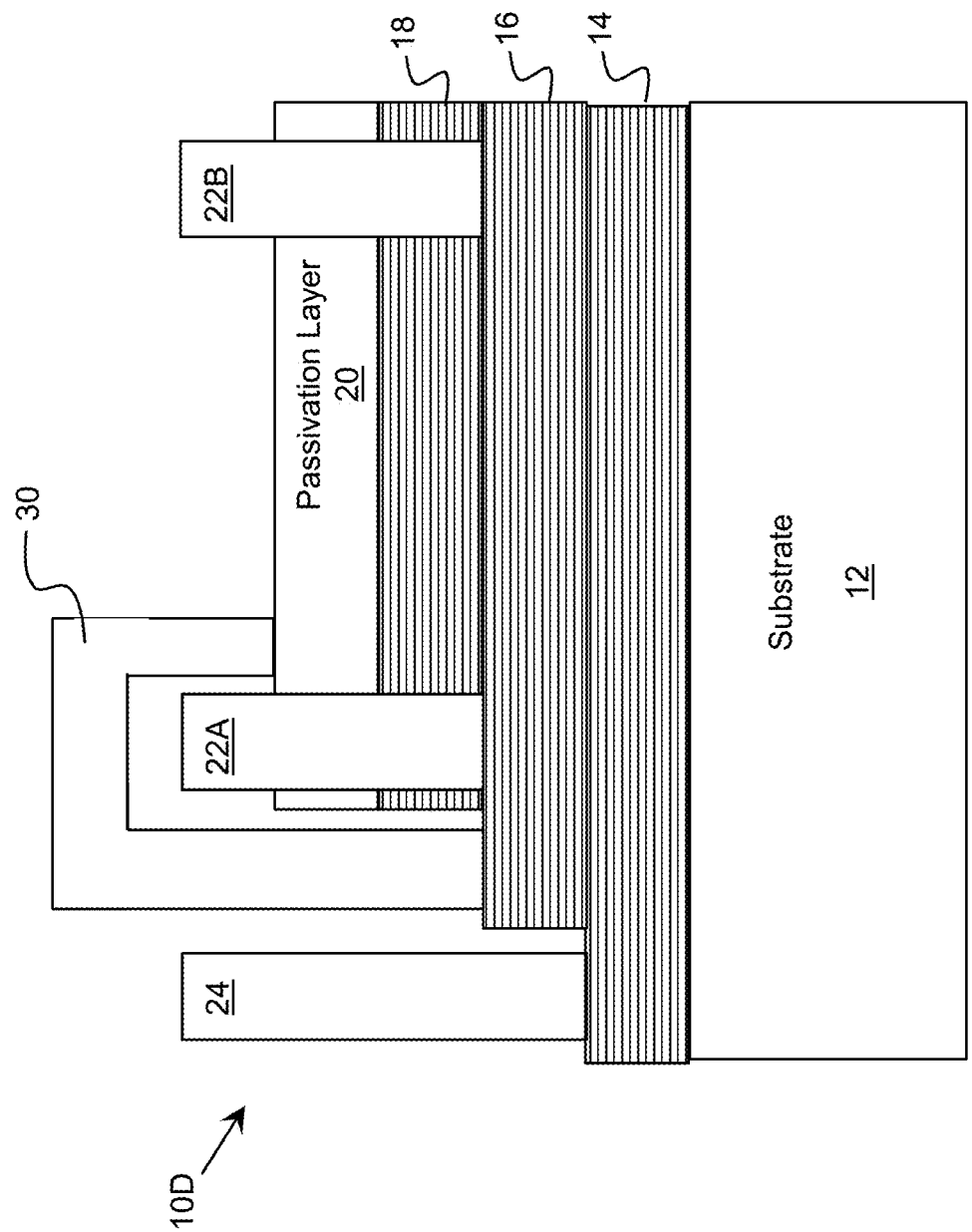
FIG. 10 shows a cross-section view of an illustrative semiconductor device according to an embodiment.

In FIG. 10, the device 10D includes a charge control electrode 30 that is connected (directly or capacitively coupled) between the passivation layer 20 and the channel 16. Furthermore, in FIG. 10, any or all of the layers 16, 18, 20 can be formed by a short-period superlattice. It is understood that the layers 16, 18, 20 in any of the embodiments provided herein can be formed by a short-period superlattice.

Figure 9:
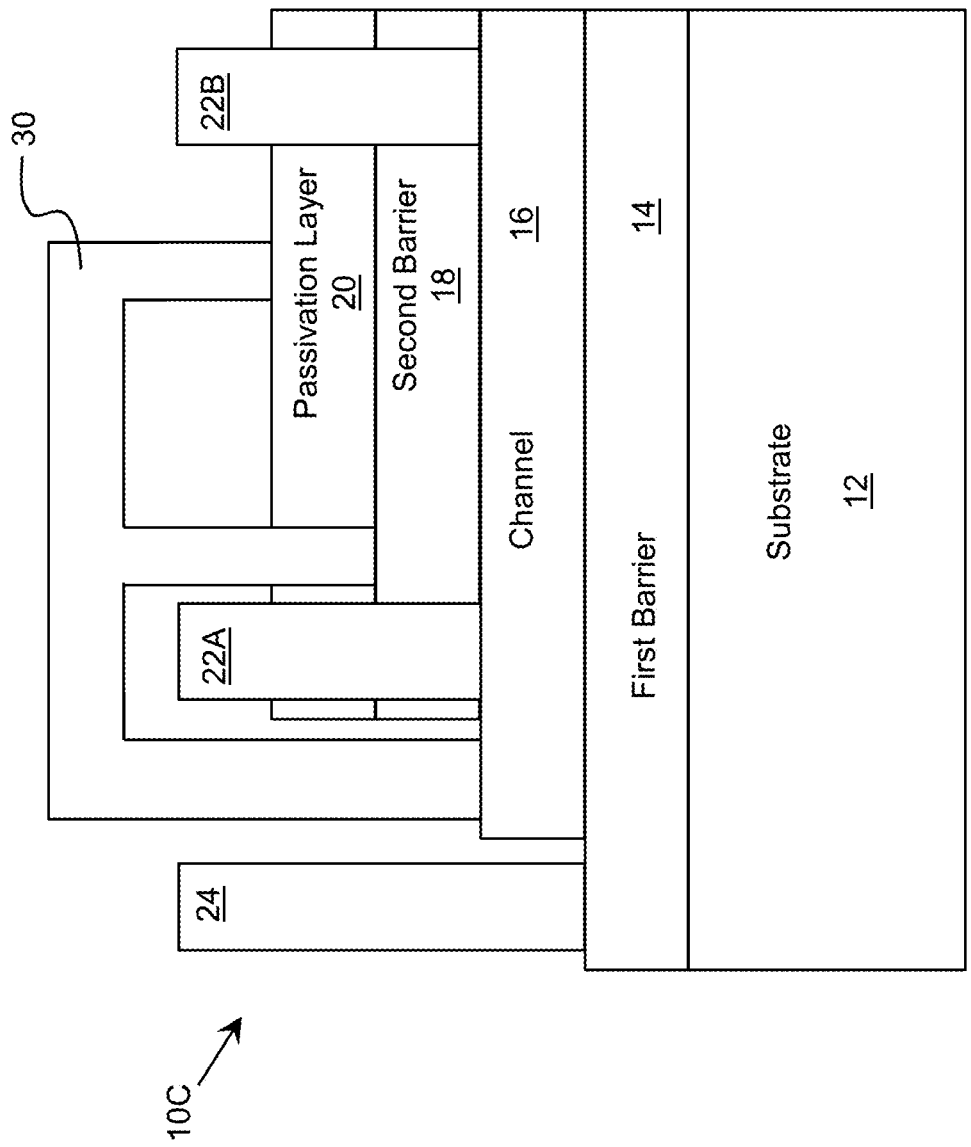
FIG. 9 shows a cross-section view of an illustrative semiconductor device according to an embodiment.

Referring now to FIGS. 8-10, each of the embodiments of the charge control electrode 30 provide more design flexibility for the device. In FIG. 8, the charge control electrode 30 has the same potential as the gate electrode 24. Therefore, applying the bias to the gate electrode 24 would also bias the charge control electrode 30. This way, the device transconductance increases compared to the devices 10C, 10D show in FIGS. 9 and 10. However, in FIGS. 9 and 10, the devices 10C, 10D have a lower gate leakage current and a large range of operational gate voltages. The device 10C shown in FIG. 9, the charge control electrode 30 has two contacts in the source-drain spacing (e.g., between the source electrode 22A and the drain electrode 22B), while the charge control electrode 30 shown in the device 10D in FIG. 10 has only one contact in the source-drain spacing. The design for the charge control electrode can depend on the device. For example, the charge control electrode 30 shown in FIG. 10 can be used in devices with a shorter source-drain spacing.

Figure 11:
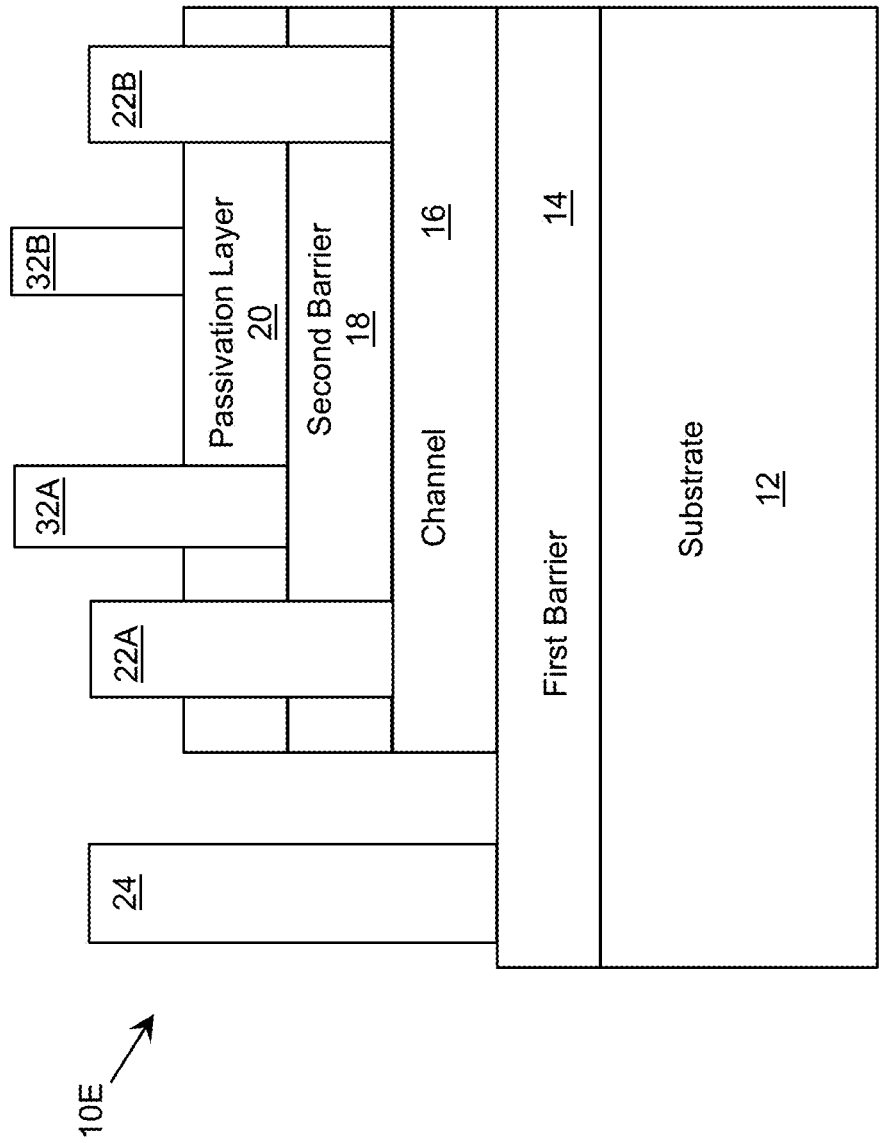
FIG. 11 shows a cross-section view of an illustrative semiconductor device according to an embodiment.

Turning now to FIG. 11, a cross-section view of an illustrative semiconductor device 10E according to an embodiment is shown. In this embodiment, the device 10E can include additional gate electrodes 32A, 32B that are connected to the passivation layer 20 and/or the second barrier 18. The additional gate electrodes 32A, 32B can be formed on the surface of these layers 18, 20 or formed in trenches formed in the layers 18, 20.

Figure 12:
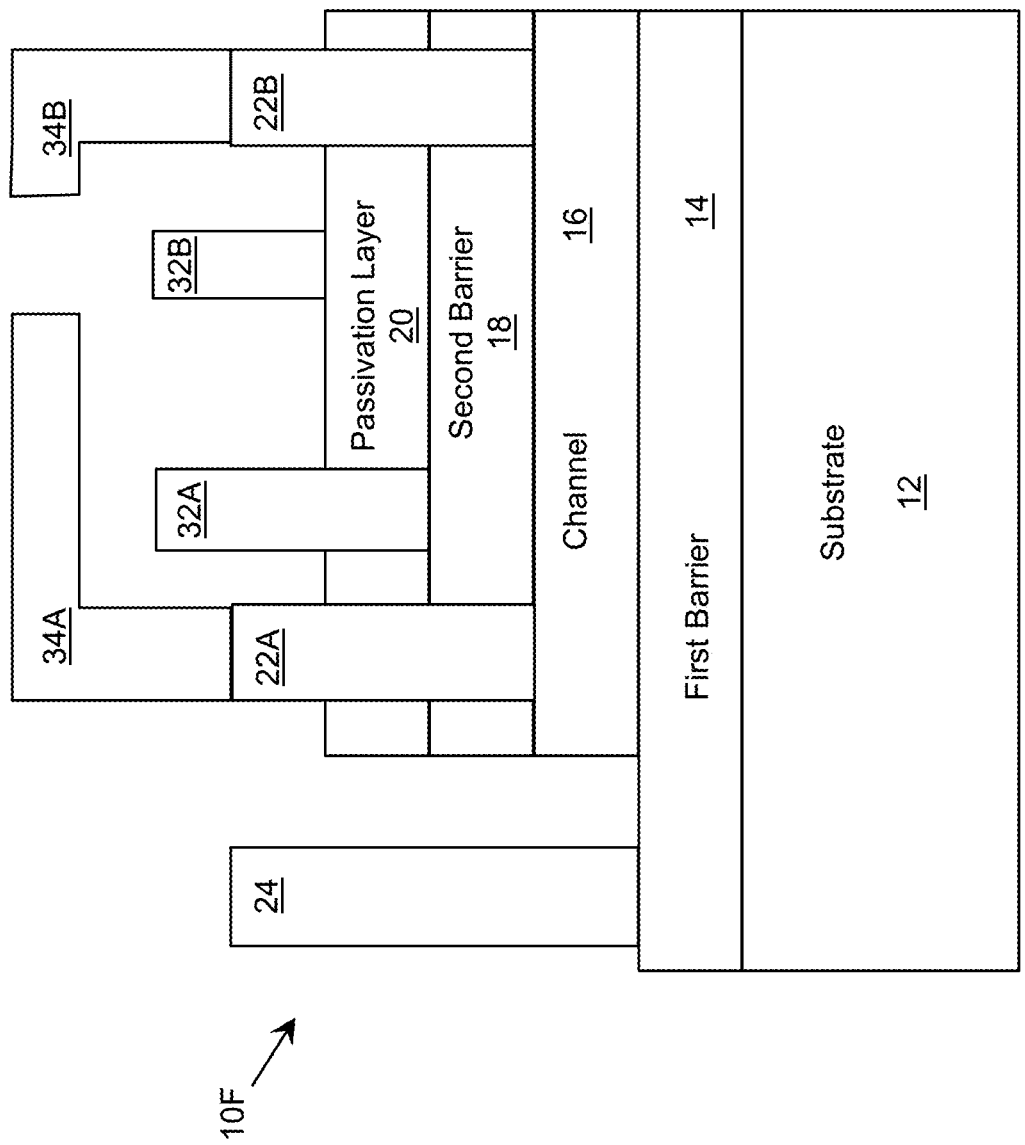
FIG. 12 shows a cross-section view of an illustrative semiconductor device according to an embodiment.
Figure 13:
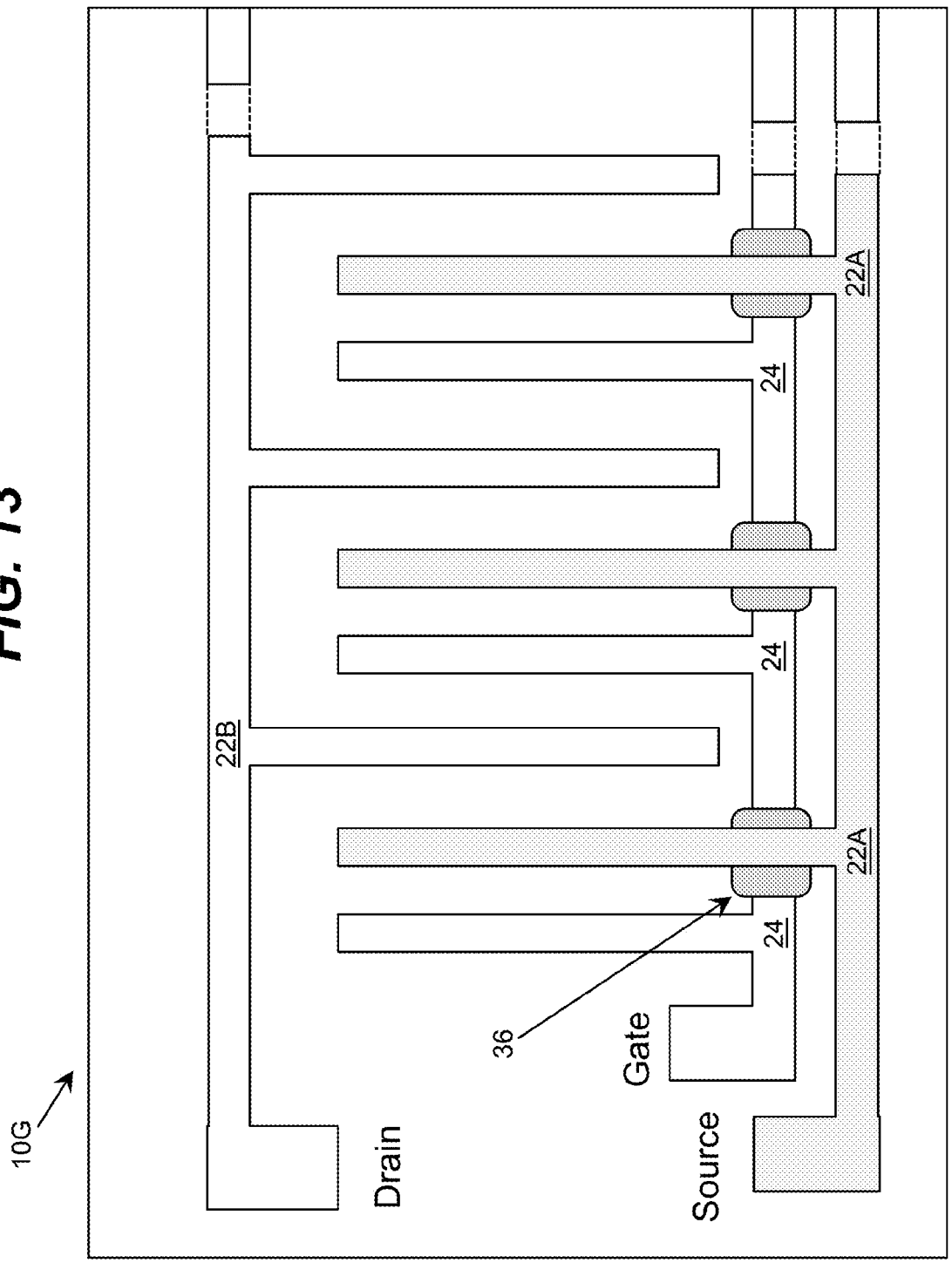
FIG. 13 shows a top view of an illustrative semiconductor device according to an embodiment.

In any of the embodiments described herein, the source electrode 22A, drain electrode 22B, and gate electrode(s) 32A, 32B, 24 can further comprise field plate electrodes that are connected (directly or capacitively coupled) to any one or more of the electrodes 22A, 22B, 24. For example, FIG. 12 shows a cross-section view of an illustrative semiconductor device 10F according to an embodiment. The device 10F is similar to the device 10E shown in FIG. 11. However, the device 10F shown in FIG. 12 includes a set of field plate electrodes 34A, 34B that are connected to the source electrode 22A and the drain electrode 22B. Furthermore, in an embodiment, the source and drain electrodes 22A, 22B can form a multifinger pattern. For example, FIG. 13 shows a top view of an illustrative semiconductor device 10G according to an embodiment. As clearly seen in FIG. 13, the source and drain electrodes 22A, 22B and the gate electrode 24 form a multifinger pattern. In an embodiment, the device 10G can include an insulator 36 between the source electrode 22A and the gate electrode 24.

Figure 14:
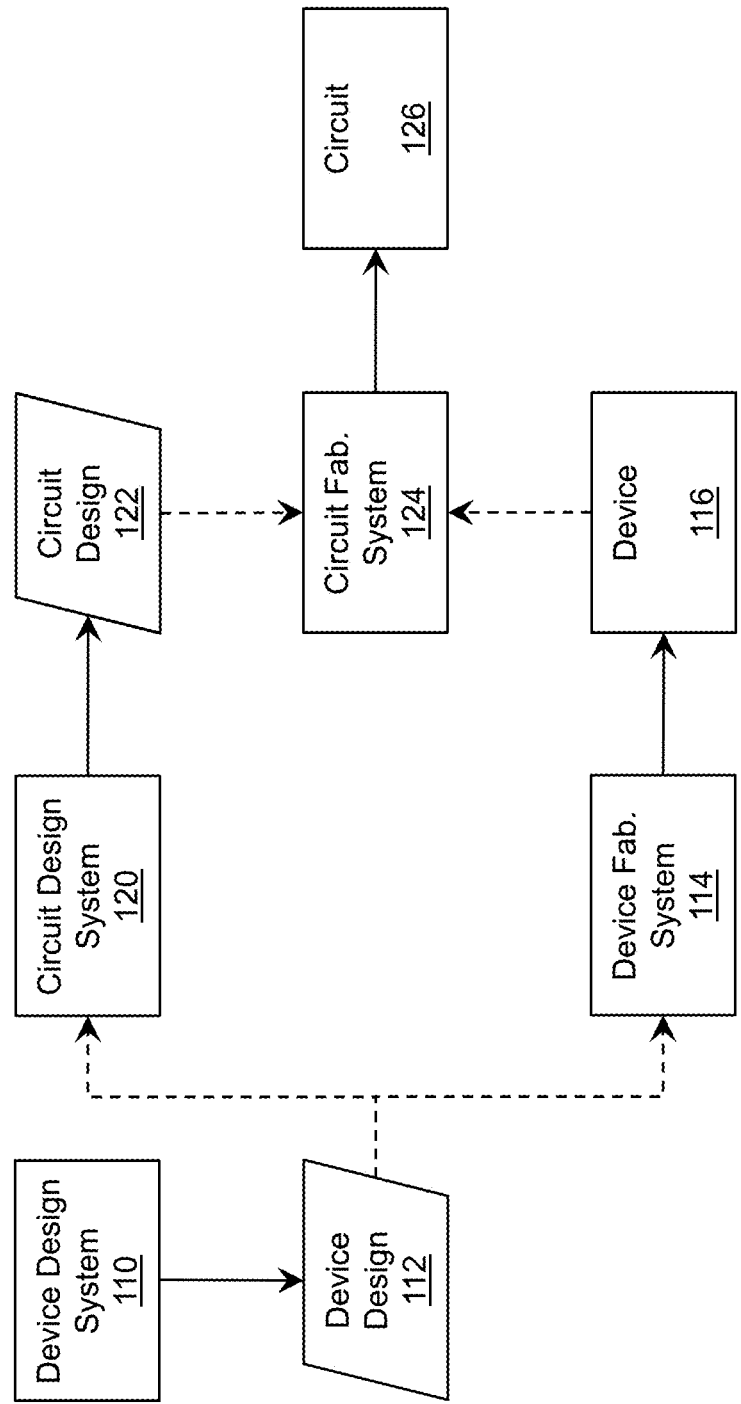
FIG. 14 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 14 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A field effect transistor comprising:
a first barrier and a second barrier;
a channel located between the first barrier and the second barrier, wherein a bandgap for each of the first barrier and the second barrier is larger than a bandgap for the channel, wherein a doping type for the first barrier is opposite to a doping type for the channel;
a source electrode and a drain electrode connected to the channel; and
a gate electrode connected to the first barrier.

2. The transistor of claim 1, wherein the first barrier is doped with p-type dopants and the channel is doped with n-type dopants.

3. The transistor of claim 1, wherein at least one of: the first barrier, the second barrier, or the channel are formed by short-period superlattices.

4. The transistor of claim 1, wherein the source electrode and drain electrode form a multifinger pattern.

5. The transistor of claim 1, further comprising a set of field-plate electrodes directly connected or capacitively coupled to at least one of: the source, drain, and gate electrodes.

6. The transistor of claim 1, further comprising a passivation layer located above the second barrier.

7. The transistor of claim 6, further comprising a charge control electrode connecting at least one of: the passivation layer or the second barrier to the channel.

8. The transistor of claim 6, further comprising at least one additional gate electrode connected to at least one of: the passivation layer or the second barrier.

9. The transistor of claim 6, further comprising a charge control electrode connecting the gate electrode to at least one of: the passivation layer or the second barrier.

10. The transistor of claim 9, wherein the charge control electrode capacitively couples the gate electrode, the passivation layer, and the second barrier.

11. A field effect transistor comprising:
a first barrier and a second barrier;
a channel located between the first barrier and the second barrier, wherein a bandgap for each of the first barrier and the second barrier is larger than a bandgap for the channel, and wherein a doping type for the first barrier is opposite to a doping type for the channel and the doping type for the channel is a same doping type as a doping type for the second barrier;
a source electrode and a drain electrode connected to the channel; and
a gate electrode connected to the first barrier.

12. The transistor of claim 11, wherein the first barrier is doped with p-type dopants and the channel is doped with n-type dopants.

13. The transistor of claim 11, wherein the source electrode and the drain electrode form a multifinger pattern.

14. The transistor of claim 11, at least one of: the first barrier, the second barrier, or the channel, is formed by a short-period superlattice.

15. The transistor of claim 11, further comprising a passivation layer located above the second barrier.

16. The transistor of claim 15, further comprising a charge control electrode connecting the gate electrode to at least one of: the passivation layer or the second barrier.

17. The transistor of claim 15, further comprising a charge control electrode connecting at least one of: the passivation layer or the second barrier to the channel.

18. The transistor of claim 15, further comprising at least one additional gate electrode connected to at least one of: the passivation layer or the second barrier.

19. A field effect transistor comprising:
a first barrier and a second barrier;
a channel located between the first barrier and the second barrier, wherein a bandgap for each of the first barrier and the second barrier is larger than a bandgap for the channel;
a passivation layer located above the second barrier;
a source electrode and a drain electrode connected to the channel;
a gate electrode connected to the first barrier, wherein the gate electrode is located on a portion of the first barrier outside of a region defined by the source electrode and the drain electrode; and
a charge control electrode connecting the gate electrode to at least one of: the passivation layer or the second barrier.

20. The transistor of claim 19, wherein a doping type for the first barrier is opposite to a doping type for the channel.

* * * * *